(12) United States Patent
Himori et al.

(10) Patent No.: US 9,412,562 B2
(45) Date of Patent: *Aug. 9, 2016

(54) CAPACITIVE COUPLING PLASMA PROCESSING APPARATUS

(71) Applicant: TOKYO ELECTRON LIMITED, Tokyo (JP)

(72) Inventors: Shinji Himori, Nirasaki (JP); Tatsuo Matsudo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/688,205

(22) Filed: Apr. 16, 2015

(65) Prior Publication Data

US 2015/0221478 A1    Aug. 6, 2015

Related U.S. Application Data

(60) Continuation of application No. 13/278,223, filed on Oct. 21, 2011, now Pat. No. 9,038,566, which is a division of application No. 11/392,811, filed on Mar. 30, 2006, now Pat. No. 8,070,911.

(60) Provisional application No. 60/666,699, filed on Mar. 31, 2005.

(30) Foreign Application Priority Data

Mar. 31, 2005   (JP) ................................. 2005-102954

(51) Int. Cl.
*H01L 21/00*   (2006.01)
*C23C 16/00*   (2006.01)
*H01J 37/32*   (2006.01)

(52) U.S. Cl.
CPC ...... *H01J 37/32082* (2013.01); *H01J 37/32091* (2013.01); *H01J 37/32532* (2013.01); *H01J 37/32568* (2013.01)

(58) Field of Classification Search
USPC .......... 118/715, 716, 719, 722, 723 R, 723 E, 118/728, 729, 730, 732; 156/345.1, 345.11, 156/345.33, 345.34, 345.35, 345.43, 345.47
See application file for complete search history.

(56) References Cited

U.S. PATENT DOCUMENTS

| 5,151,845 A | 9/1992 | Watanabe et al. |
| 5,609,690 A | 3/1997 | Watanabe et al. |

(Continued)

FOREIGN PATENT DOCUMENTS

| JP | 2005-72347 | 3/2005 |
| WO | WO 02/78040 | 3/2002 |

*Primary Examiner* — Parviz Hassanzadeh
*Assistant Examiner* — Anna Crowell
(74) *Attorney, Agent, or Firm* — Oblon, McClelland, Maier & Neustadt, L.L.P.

(57) ABSTRACT

A capacitive coupling plasma processing apparatus includes a process chamber configured to have a vacuum atmosphere, and a process gas supply section configured to supply a process gas into the chamber. In the chamber, a first electrode and a second electrode are disposed opposite each other. The second electrode includes a plurality of conductive segments separated from each other and facing the first electrode. An RF power supply is configured to apply an RF power to the first electrode to form an RF electric field within a plasma generation region between the first and second electrodes, so as to turn the process gas into plasma by the RF electric field. A DC power supply is configured to apply a DC voltage to at least one of the segments of the second electrode.

14 Claims, 15 Drawing Sheets

(56) References Cited

U.S. PATENT DOCUMENTS

| | | |
|---|---|---|
| 5,708,250 A | 1/1998 | Benjamin et al. |
| 5,733,511 A | 3/1998 | De Francesco |
| 5,919,332 A | 7/1999 | Koshiishi et al. |
| 6,000,360 A | 12/1999 | Koshimizu |
| 6,110,287 A | 8/2000 | Arai et al. |
| 6,239,403 B1 | 5/2001 | Dible et al. |
| 6,624,084 B2 | 9/2003 | Maeda et al. |
| 6,806,652 B1 | 10/2004 | Chistyakov |
| 2001/0050144 A1 | 12/2001 | Nishikawa et al. |
| 2003/0086840 A1 | 5/2003 | Himori et al. |
| 2003/0141017 A1 | 7/2003 | Fujisato |
| 2004/0074604 A1 | 4/2004 | Ichiki et al. |

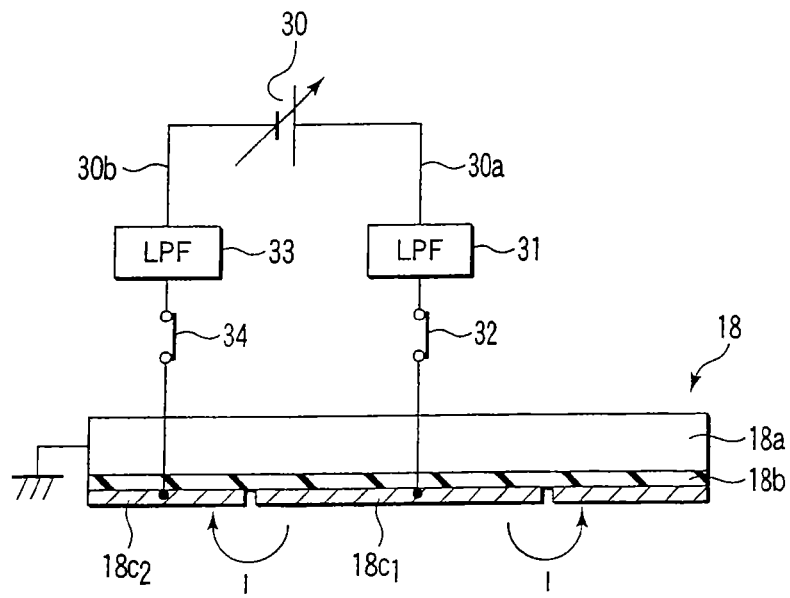
F I G. 6
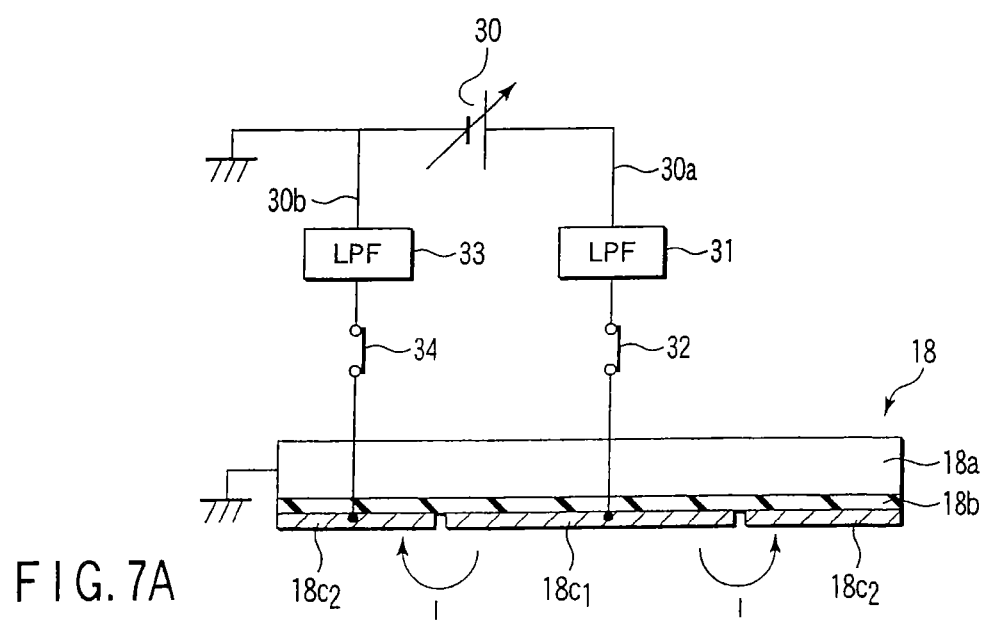
F I G. 7A
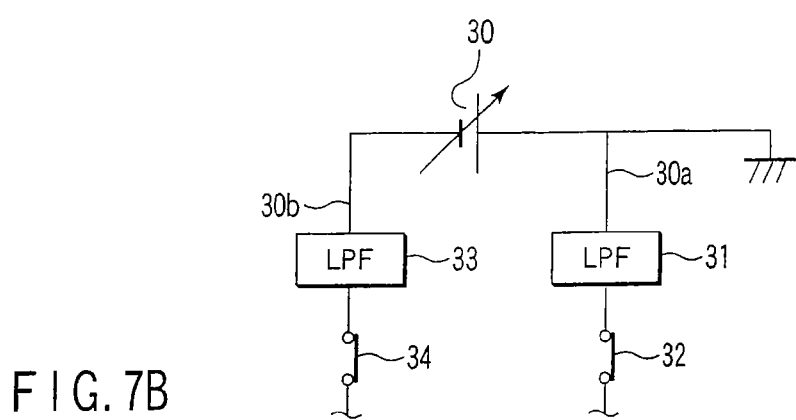
F I G. 7B

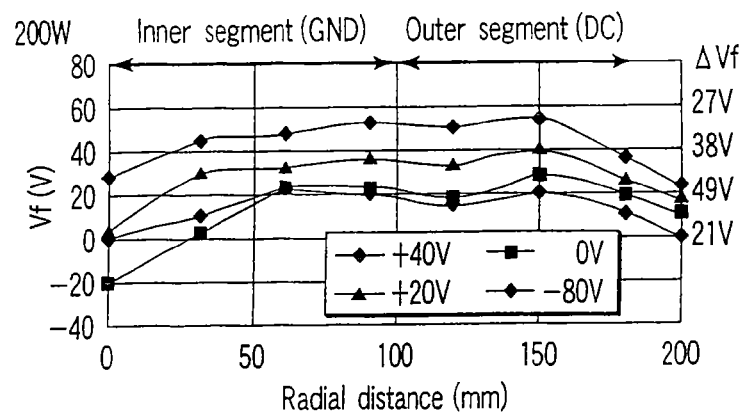
F I G. 12A
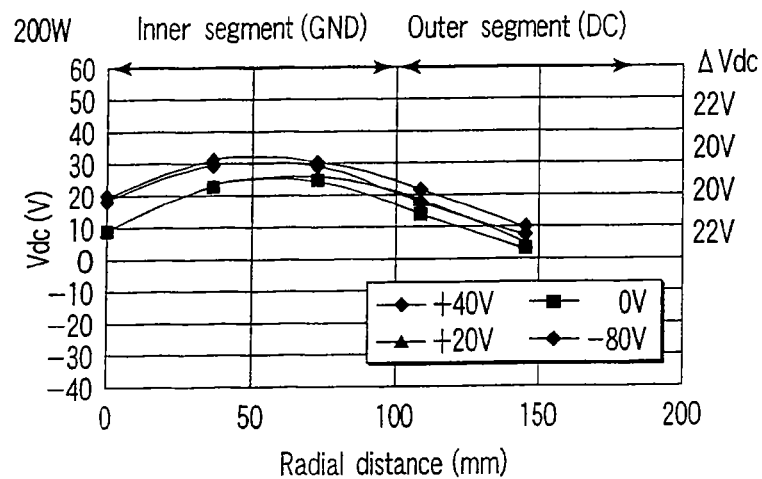
F I G. 12B
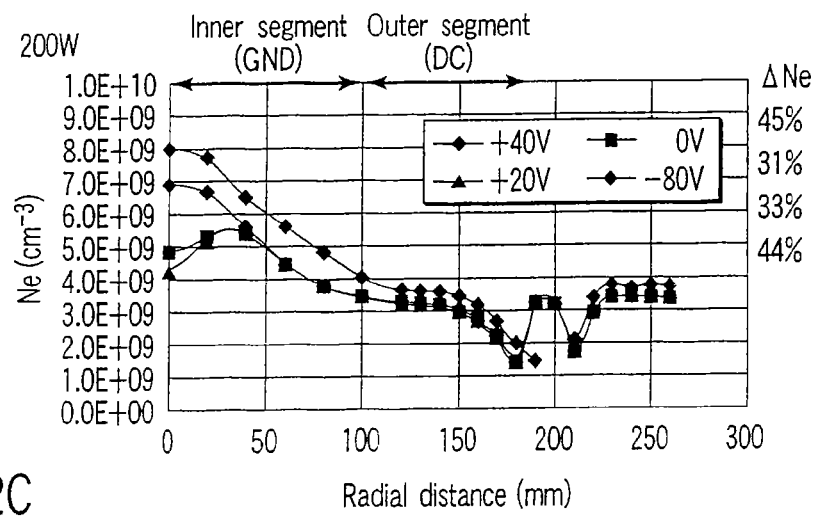
F I G. 12C

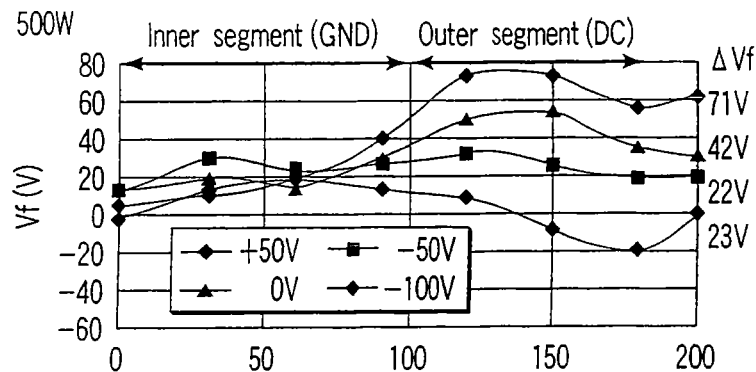
F I G. 14A
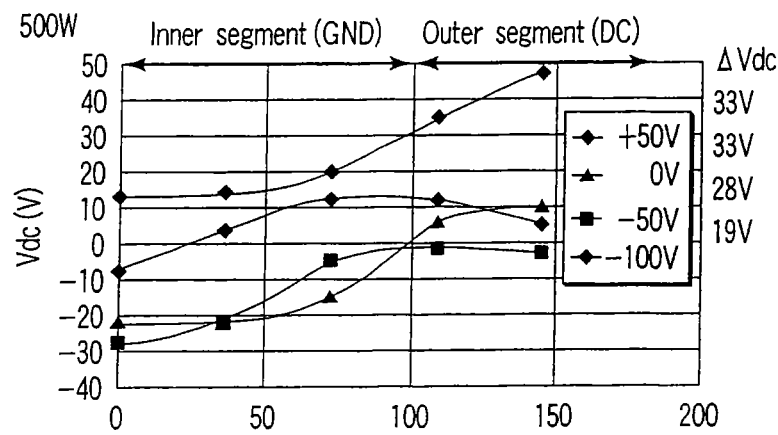
F I G. 14B
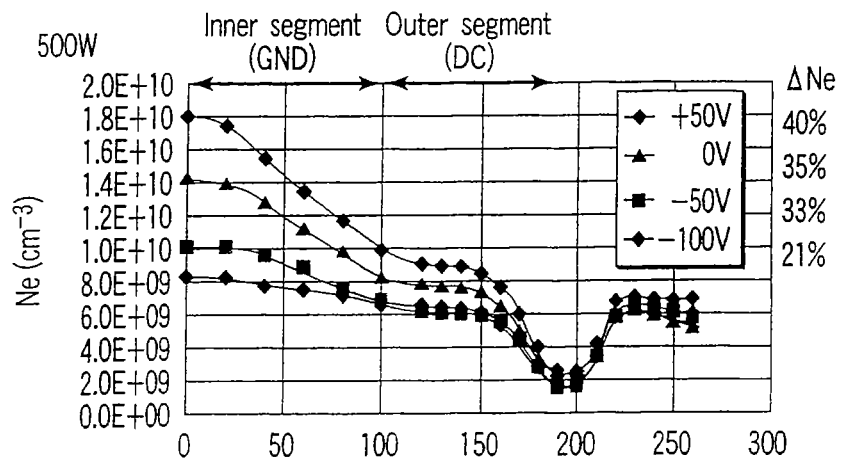
F I G. 14C

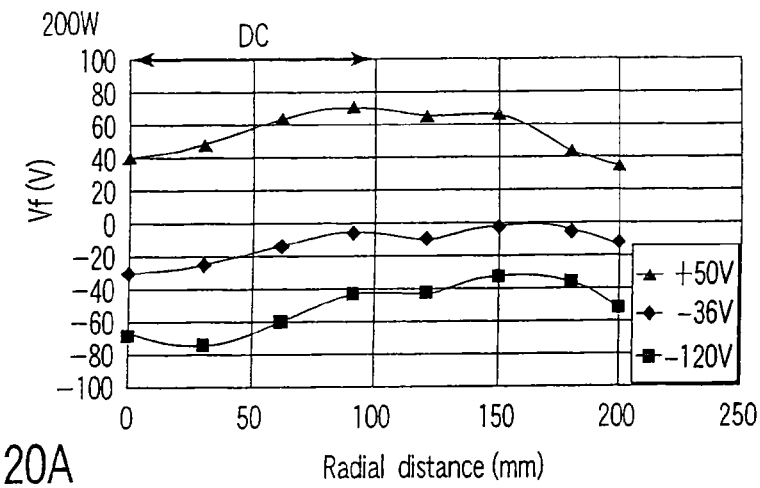
F I G. 20A
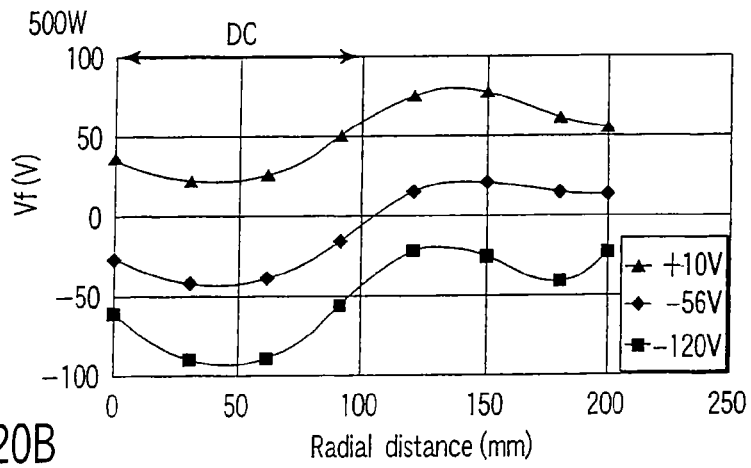
F I G. 20B
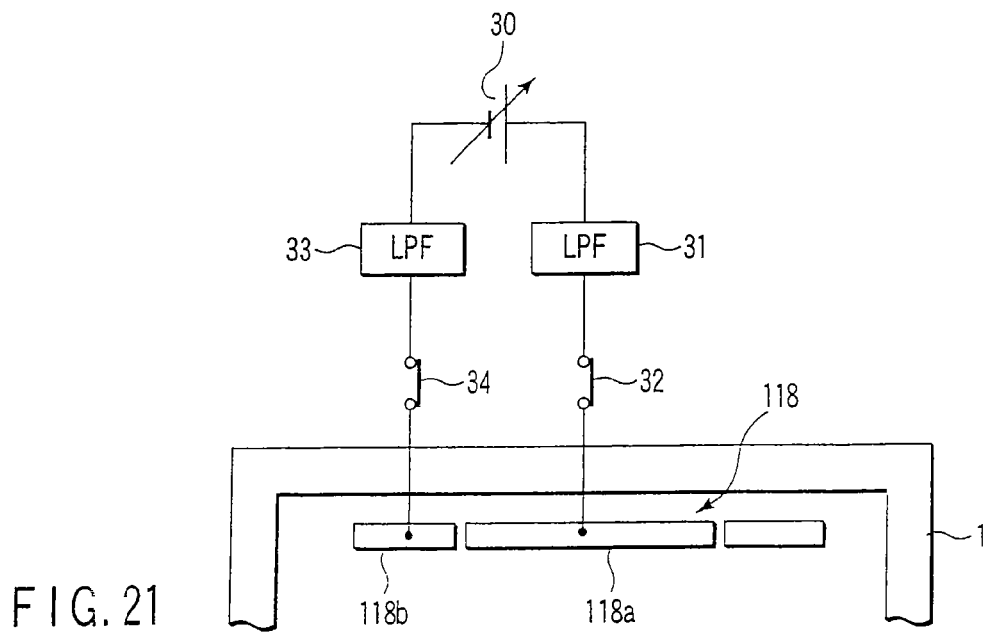
F I G. 21

CAPACITIVE COUPLING PLASMA PROCESSING APPARATUS

CROSS-REFERENCE TO RELATED APPLICATIONS

This application is continuation application of Ser. No. 13/278,228, filed Oct. 21, 2011, now U.S. Pat. No. 9,038,566, which is a divisional application of Ser. No. 11/392,811, filed Mar. 30, 2006, now U.S. Pat. No. 8,070,911, the entire contents of both of which are incorporated herein by reference. U.S. application Ser. No. 11/392,811, also claims the benefit of U.S. Provisional Application No. 60/666,699, filed Mar. 31, 2005. This application is based upon and claims the benefit of priority from prior Japanese Patent Application No. 2005-102954, filed Mar. 31, 2005, the entire contents of which are incorporated herein by reference.

BACKGROUND OF THE INVENTION

1. Field of the Invention

The present invention relates to a plasma processing apparatus of the capacitive coupling type, used for performing a plasma process on a target substrate in, e.g., a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

For example, in manufacturing semiconductor devices, plasma processes, such as etching, sputtering, and CVD (Chemical Vapor Deposition), are often used for processing a target substrate or semiconductor wafer. There are various plasma processing apparatuses for performing such plasma processes, but parallel-plate plasma processing apparatuses of the capacitive coupling type are the ones in mainstream use.

In general, a parallel-plate plasma etching apparatus of the capacitive coupling type includes a process chamber with a pair of parallel-plate electrodes (upper and lower electrodes) disposed therein. When a process is performed, while a process gas is supplied into the chamber, an RF (radio frequency) power is applied to one of the electrodes to form an RF electric field between the electrodes, thereby causing RF electric discharge. The process gas is turned into plasma by the RF electric field, thereby performing, e.g., plasma etching on a predetermined layer disposed on a semiconductor wafer.

For example, there is an apparatus of this kind in which an RF power is applied to the lower electrode on which the semiconductor wafer is placed. In this case, the lower electrode serves as a cathode electrode, and the upper electrode serves as an anode electrode. The RF power applied to the lower electrode is used for plasma generation and also for an RF bias applied to the target substrate.

In the parallel-plate plasma processing apparatus of the capacitive coupling type, the upper electrode serving as an anode electrode needs to be protected from metal contamination and wear-out. For this reason, the upper electrode is formed of a metal base body having a surface covered with a coating made of an oxide film or insulative ceramic with high resistance to plasma, such as $Y_2O_3$.

Plasma is generated by RF electric discharge caused between the electrodes, and electron and ion currents generated thereby are neutralized at the ground potential. Accordingly, relative to the ground potential, the insulating film covering the upper electrode comes to have a potential, by which the plasma potential is determined.

In recent years, design rules in manufacturing semiconductor devices have been increasingly miniaturized. Particularly, in plasma etching, it is required to improve the dimensional accuracy, selectivity relative to the mask and under-layer, and planar uniformity of the etching. For this reason, the recent trend is to use a lower pressure and lower ion energy in the process field within a chamber. This trend has brought about the use of an RF power with a frequency of 27 MHz or more, which is far higher than the frequency conventionally used.

However, where a lower pressure and lower ion energy are used, as described above, it becomes necessary to address a decrease in the planar uniformity of plasma potential, which previously had been negligible. Specifically, in conventional apparatuses using high ion energy, poor planar uniformity of plasma potential does not cause a serious problem. However, as the pressure and ion energy are set to be lower, poor planar uniformity of plasma potential can easily make the process less uniform and easily cause charge-up damage.

In this respect, U.S. Pat. No. 6,624,084 (Patent Document 1) discloses a technique concerning a plasma processing apparatus. Specifically, this document discloses a technique of improving the planar uniformity of self-bias on a wafer generated by RF bias application, to reduce micro defects, such as charge-up damage. In order to achieve this, current path reform means is disposed for that portion of the RF current path of the RF bias applied to the wafer that is close to the periphery of the wafer, to cause an RF current to flow toward the surface of the counter electrode facing the wafer. Alternatively, impedance adjusting means is used to cause the impedance from the RF bias to ground to be almost uniform planarly on the wafer.

However, the technique of Patent Document 1 requires the current path reform means or impedance adjusting means and thus makes the apparatus structure complicated. Further, this technique is not necessarily sufficient in the planar uniformity of plasma processing.

BRIEF SUMMARY OF THE INVENTION

An object of the present invention to provide a plasma processing apparatus of the capacitive coupling type, which brings about a high planar uniformity of plasma processing, and prevents charge-up damage.

According to a first aspect of the present invention, there is provided a capacitive coupling plasma processing apparatus comprising:
  a process chamber configured to have a vacuum atmosphere;
  a process gas supply section configured to supply a process gas into the chamber;
  a first electrode disposed in the chamber;
  a second electrode disposed opposite the first electrode in the chamber, and comprising a plurality of conductive segments separated from each other and facing the first electrode;
  a support member configured to support the target substrate between the first and second electrodes such that a process target surface of the target substrate faces the second electrode,
  an RF power supply configured to apply an RF power to the first electrode to form an RF electric field within a plasma generation region between the first and second electrodes, so as to turn the process gas into plasma by the RF electric field; and a DC power supply configured to apply a DC voltage to at least one of the segments of the second electrode.

According to a second aspect of the present invention, there is provided a capacitive coupling plasma processing apparatus comprising:

a process chamber configured to have a vacuum atmosphere;

a process gas supply section configured to supply a process gas into the chamber;

a first electrode disposed in the chamber and configured to support a target substrate thereon;

a second electrode disposed opposite the first electrode in the chamber, and comprising an inner segment and an outer segment disposed around and separated from the inner segment, an RF power supply configured to apply an RF power to the first electrode to form an RF electric field within a plasma generation region between the first and second electrodes, so as to turn the process gas into plasma by the RF electric field; and a DC power supply configured to apply a DC voltage to at least one of the inner segment and the outer segment, such that the DC voltage of the DC power supply is applied to cause the inner segment to have an electric potential higher than that of the outer segment.

In the apparatus according to the first and second aspects, the spatial electric potential distribution is uniformized, so that the substrate receives ion energy incident thereon with a uniform distribution. Further, the uniform ion energy brings about uniform electron energy in plasma generation, thereby resulting in a uniform electron density distribution. Consequently, it is possible to improve the planar uniformity of the etching process, and to reduce the charge-up damage, such as dielectric breakdown of gate oxide films.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 6 is a view schematically showing a system for applying a DC (direct current) voltage to the segments used in the plasma etching apparatus shown in FIG. 1;

FIGS. 7A and 7B are views schematically showing modifications of a system for applying a DC voltage to the segments usable in the plasma etching apparatus shown in FIG. 1;

FIGS. 12A, 12B, and 12C are views showing the planar distribution of plasma potential Vf, planar distribution of self-bias voltage Vdc, and planar distribution of electron density distribution Ne, respectively, where the RF power was set at 200 W, the inner segment was grounded, and the outer segment was supplied with the DC voltage at different voltage values;

FIGS. 14A, 14B, and 14C are views showing the planar distribution of plasma potential Vf, planar distribution of self-bias voltage Vdc, and planar distribution of electron density distribution Ne, respectively, where the RF power was set at 500 W, the inner segment was grounded, and the outer segment was supplied with the DC voltage at different voltage values;

FIGS. 20A and 20B are views showing planar distribution of plasma potential Vf, where the RF power was set at 200 W and 500 W, respectively, and the inner segment was supplied with the DC voltage at different voltage values while no voltage was applied from a distribution control power supply; and FIG. 21 is a view schematically showing another example of an upper electrode.

DETAILED DESCRIPTION OF THE INVENTION

Figure 1:
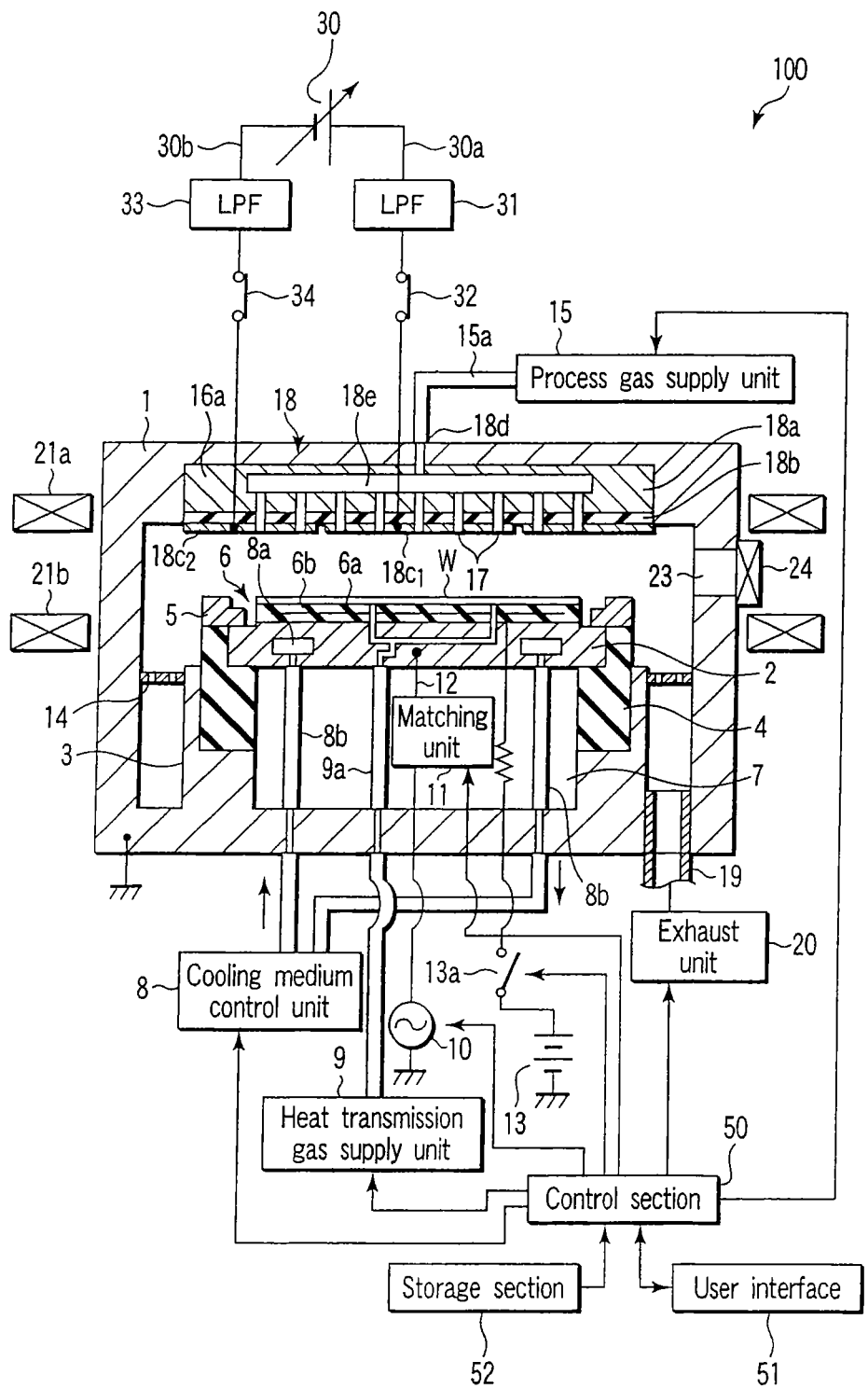
FIG. 1 is a sectional view showing a plasma etching apparatus or plasma processing apparatus according to an embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

FIG. 1 is a sectional view showing a plasma etching apparatus as a plasma processing apparatus according to an embodiment of the present invention. This plasma etching apparatus 100 includes an airtight process chamber 1 having an essentially cylindrical shape. For example, the chamber 1 has a main body made of a metal, such as aluminum, with an inner surface covered with an insulating film formed thereon, such as an oxidization processed film, or insulative ceramic film of, e.g., $Y_2O_3$ (for example, a thermal spraying film). The chamber 1 is grounded.

A support table 2 is disposed in the chamber 1 and configured to horizontally support a target substrate or wafer W and to also serve as a lower electrode. For example, the support table 2 is made of aluminum with an oxidization processed surface. A support portion 3 having a ring shape extends upward from the bottom of the chamber 1 at a position corresponding to the periphery of the support table 2. An insulating member 4 having a ring shape is disposed on the support portion 3, to support the periphery of the support table 2. Further, a focus ring 5 made of a conductive material or insulative material is placed on the periphery of the top of the support table 2. A baffle plate 14 is disposed between the insulating member 4 and the wall of the chamber 1. An inner void 7 is formed between the support table 2 and the bottom of the chamber 1.

The support table 2 is provided with an electrostatic chuck 6 on the top surface, for holding a wafer W by an electrostatic attraction force. The electrostatic chuck 6 comprises an electrode 6a and a pair of insulating layers 6b sandwiching the electrode 6. The electrode 6 is connected to a DC (direct current) power supply 13 through a switch 13a. The semiconductor wafer W is attracted and held by an electrostatic force, e.g., a Coulomb force, generated by a voltage applied from the DC power supply 13 to the electrode 6a.

A cooling medium passage 8a is formed in the support table 2, and is connected to cooling medium lines 8b. A suitable cooling medium is supplied and circulated within the cooling medium passage 8a from a cooling medium control unit 8 through the cooling medium lines 8b to control the support table 2 at a suitable temperature. Further, a heat transmission gas line 9a is disposed to supply a heat transmission gas, such as He gas, into the interstice between the top surface of the electrostatic chuck 6 and the bottom surface of the wafer W. The heat transmission gas is supplied from a heat transmission gas supply unit 9 through the gas line 9a to the bottom surface of the wafer W. Consequently, even when the interior of the chamber 1 is exhausted and maintained in a vacuum state, cold of the cooling medium circulated in the cooling medium passage 8a is efficiently transmitted, thereby improving the temperature control of the wafer W.

A power feed line 12 for supplying an RF (radio frequency) power is connected near the center of the support table 2. The power feed line 12 is connected to a matching unit 11 and an RF power supply 10. The RF power supply 10 is configured to apply an RF power with a predetermined frequency to the support table 2.

Figure 2:
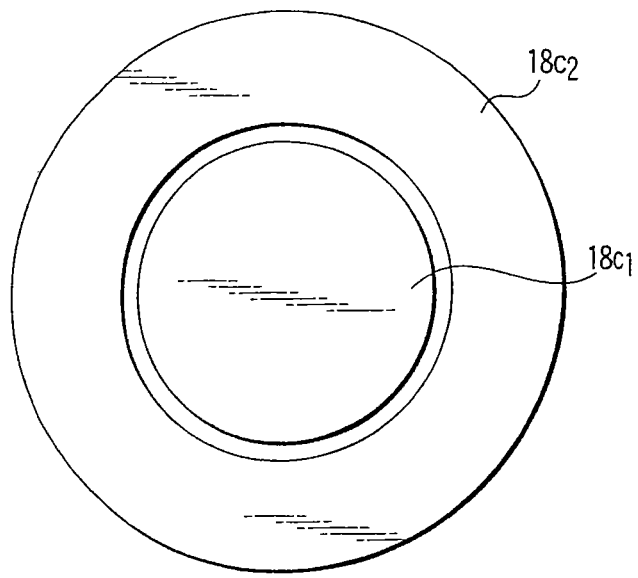
FIG. 2 is a view schematically showing a plan view layout of an inner segment and an outer segment used in the upper electrode of the plasma etching apparatus shown in FIG. 1.

On the other hand, a disk-like showerhead 18 used as an upper electrode (thus which will be also referred to as an upper electrode 18) is disposed above and opposite the support table 2. The showerhead 18 is fitted in the ceiling of the chamber 1. The showerhead 18 includes a main body 18a made of a metal or semiconductor, such as carbon or Si. The surface of the main body 18a facing the support table 2 is covered with an insulating film 18b for preventing metal contamination, wear-out due to plasma, and generation of scratches. Further, the insulating film 18b is covered with an inner segment $18_{c1}$ and an outer segment $18_{c2}$, which are conductive and concentrically separated on the inner and outer sides, respectively. FIG. 2 is a view schematically showing a plan view layout of the inner segment $18_{c1}$ and outer segment $18_{c2}$ used in the upper electrode 18 of the plasma etching apparatus shown in FIG. 1. The insulating film 18b is formed of an oxidization processed film, or insulative ceramic film of, e.g., $Y_2O_3$ (for example, a thermal spraying film).

A number of gas delivery holes 17 are formed to penetrate a lower portion of the main body 18a, the insulating film 18b, and segments $18_{c1}$ and $18_{c2}$. The gas delivery holes 17 communicate with a space 18e formed in the main body 18a and a gas supply port 18d formed at the top of the main body 18a. The gas supply port 18d is connected through a gas supply line 15a to a process gas supply unit 15 for supplying a process gas for etching.

The main body 18a of the upper electrode 18 is grounded through the chamber 1 and cooperates with the lower electrode or support table 2 supplied with an RF power, to define a pair of parallel-plate electrodes. The lower electrode or support table 2 supplied with an RF power serves as a cathode electrode, while the grounded upper electrode 18 serves as an anode electrode. A plasma generation region for turning the process gas into plasma is defined between the upper electrode 18 and support table 2.

The inner segment $18_{c1}$ and outer segment $18_{c2}$ are connected to variable DC power supply 30 to apply a DC voltage therebetween. Specifically, the inner segment $18_{c1}$ is connected to the positive terminal, and the outer segment $18_{c2}$ is connected to the negative terminal. The variable DC power supply 30 is connected to the inner segment $18_{c1}$ through a feed line 30a provided with a low-pass filter (LPF) 31 and a relay switch 32. The variable DC power supply 30 is connected to the outer segment $18_{c2}$ through a feed line 30b provided with a low-pass filter (LPF) 33 and a relay switch 34. The inner segment $18_{c1}$ and outer segment $18_{c2}$ serve to supply a voltage to the plasma space. The inner segment $18_{c1}$ and outer segment $18_{c2}$ can be formed by various methods including film formation techniques, such as bonding, thermal spraying, and CVD. The variable DC power supply 30 is preferably formed of a bipolar power supply.

The process gas for etching can be selected from various conventional process gases, and it may be a gas containing a halogen element, such as a fluorocarbon gas ($C_xF_y$) or hydrofluorocarbon gas ($CpHqF_r$). The process gas may further contain a rare gas, such as Ar or He, $N_2$ gas, or $O_2$ gas. Where the process gas is used for ashing, the process gas may be, e.g., $O_2$ gas.

The process gas is supplied from the process gas supply unit 15 through the gas supply line 15a and gas supply port 18d into the space 18e inside the main body 18a. Then, the process gas is delivered from the gas delivery holes 17 and used for etching a film formed on the wafer W.

The bottom of the chamber 1 is connected through an exhaust line 19 to an exhaust unit 20 including a vacuum pump or the like. The exhaust unit 20 is configured to reduce the pressure inside the chamber 1 to a predetermined vacuum level by the vacuum pump. A transfer port 23 for the wafer W is formed in the upper portion of the sidewall of the chamber 1, and is opened/closed by a gate valve 24 attached thereon.

On the other hand, two ring magnets 21a and 21b are disposed coaxially around the chamber 1 at positions above and below the transfer port 23 of the chamber 1. The ring magnets 21a and 21b are configured to form a magnetic field around the process space between the support table 2 and upper electrode 18. The ring magnets 21a and 21b are rotatable by a rotation mechanism (not shown).

In each of the ring magnets 21a and 21b, a plurality of segment magnets formed of permanent magnets are disposed to be a ring in a multi-pole state. Specifically, in each of the ring magnets 21a and 21b, the magnetic poles of adjacent segment magnets are oriented in opposite directions. Consequently, magnetic force lines are formed between adjacent segment magnets, such that a magnetic field of, e.g., 0.02 to 0.2 T (200 to 2000 Gauss), and preferably of 0.03 to 0.045 T (300 to 450 Gauss), is formed only around the process space, while essentially no magnetic field is formed at the position where the wafer is placed. Consequently, it is possible to obtain a suitable effect of confining plasma. It should be noted that "essentially no magnetic field is formed at the position where the wafer is placed" is not limited to a case where no magnetic field is present. For example, this concept includes a case where a magnetic field is formed at the position where the wafer is placed, but the magnetic field has essentially no effect on the plasma process.

Figure 3:
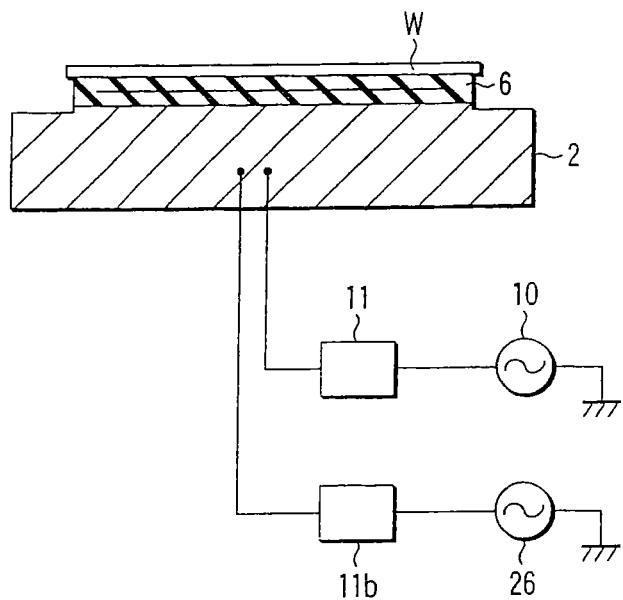
FIG. 3 is a sectional view schematically showing a structure where an RF (radio frequency) power supply for plasma generation and an RF power supply for ion attraction are connected to a lower electrode used as a support table.

In order to adjust the plasma density and ion attraction, an RF power for plasma generation may be superposed with an RF power for ion attraction from plasma. Specifically, as shown in FIG. 3, in addition to the RF power supply 10 for plasma generation connected to the matching unit 11, an RF power supply 26 for ion attraction is connected to a matching unit 11b to superpose the RF powers. In this case, the RF power supply 10 for plasma generation 10 is preferably set to have a frequency within a range of 27 MHz to 160 MHz. The RF power supply 26 for ion attraction is preferably set to have a frequency within a range of 500 KHz to 27 MHz. With this arrangement, ion energy can be controlled to further increase the plasma processing rate, such as an etching rate.

The respective components of the plasma etching apparatus 100 are connected to the control section (process controller) 50 and controlled thereby. Specifically, the control section 50 is configured to control the cooling medium control unit 8, the heat transmission gas supply unit 9, the exhaust unit 20, the switch 13a of the DC power supply 13 for the electrostatic chuck 6, the RF power supply 10, and the matching unit 11.

The control section 50 is connected to a user interface 51 including, e.g., a keyboard and a display, wherein the keyboard is used for a process operator to input commands for operating the plasma etching apparatus 100, and the display is used for showing visualized images of the operational status of the plasma processing apparatus 100.

Further, the control section 50 is connected to a storage section 52 that stores control programs for the control section 50 to control the plasma etching apparatus 100 so as to perform various processes, and programs or recipes for respective components of the plasma etching apparatus 100 to perform processes in accordance with process conditions. Recipes may be stored in a hard disk or semiconductor memory, or stored in a portable storage medium, such as a CDROM or DVD, to be attached to a predetermined position in the storage section 52.

A required recipe is retrieved from the storage section 52 and executed by the control section 50 in accordance with an instruction or the like through the user interface 51. As a consequence, the plasma etching apparatus 100 can perform a predetermined process under the control of the control section 50.

Next, an explanation will be given of a process operation of the plasma etching apparatus having the structure described above.

At first, the gate valve 24 of the plasma etching apparatus 100 shown in FIG. 1 is opened, and a wafer W having a layer to be etched is transferred into the chamber 1 and placed on the support table 2 by a transfer arm. After the transfer arm is retreated therefrom and the gate valve 24 is closed, the interior of the chamber 1 is exhausted by the vacuum pump of the exhaust unit 20 through the exhaust line 19 to set the pressure inside the chamber 1 to be a predetermined vacuum level.

Thereafter, a process gas for etching is supplied from the process gas supply unit 15 into the chamber 1 at a predetermined flow rate, so that the pressure inside the chamber 1 is set to be a predetermined value within a range of, e.g., about 0.13 to 133.3 Pa (1 to 1,000 mTorr). While the chamber 1 is maintained at a predetermined pressure, an RF power with a frequency of 27 MHz or more, such as 100 MHz, is applied from the RF power supply 10 to the support table 2. At the same time, a predetermined voltage is applied from the DC power supply 13 to the electrode 6a of the electrostatic chuck 6 to attract and hold the wafer W by, e.g., a Coulomb force.

With the RF power applied to the lower electrode or support table 2 as described above, an RF electric field is formed in the process space (plasma generation region) between the upper electrode or showerhead 18 and the lower electrode or support table 2. The process gas supplied into the process space is turned into plasma by the RF electric field, and the etching target layer on the wafer W is etched by the plasma.

During this etching, a magnetic field is formed around the process space by the ring magnets 21a and 21b configured in a multi-pole state. This magnetic field brings about the effect of confining the plasma to make the plasma more uniform, even where the apparatus employs an RF power with a frequency that tends to generate less uniform plasma as in this embodiment. The magnetic field may have no effect, depending on the type of the film, but, in such a case, the segment magnets can be rotated to form essentially no magnetic field around the process space during the process.

When the magnetic field is formed, the conductive or insulative focus ring 5 disposed around the wafer W on the support table 2 enhances the effect of making the plasma process more uniform. Specifically, where the focus ring 5 is made of a conductive material, such as silicon or SiC, the area serving as a lower electrode expands to the focus ring. Consequently, the plasma generation region is enlarged to a position above the focus ring 5, and the plasma generation is promoted on the peripheral portion of the wafer W, thereby improving the etching rate to be more uniform. Where the focus ring 5 is made of an insulative material, such as quartz, the focus ring 5 cannot transfer electric charges to and from electrons and ions in plasma. In this case, the effect of confining plasma is enhanced, thereby improving the etching rate to be more uniform.

As described above, the counter surface of the upper electrode 18 is covered with the conductive inner segment $18_{c1}$ and outer segment $18_{c2}$, and the planar uniformity of the electric field is thereby improved on this conductive counter surface, so the plasma process on the wafer W is improved to be more uniform. A detailed explanation on this matter will be given below.

Figure 4:
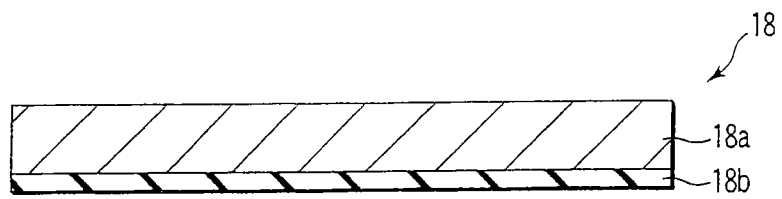
FIG. 4 is a view schematically showing the structure of an electrode plate used as an upper electrode in a conventional plasma etching apparatus.

FIG. 4 is a view schematically showing the structure of an electrode plate used as an upper electrode in a conventional plasma etching apparatus. Conventionally, as shown in FIG. 4, the surface of the main body 18a of an upper electrode 18 is covered with an insulating film 18b formed thereon, such as an oxidization processed film, or insulative ceramic film of, e.g., $Y_2O_3$ (for example, a thermal spraying film), for preventing metal contamination and wear-out due to plasma. In this case, the insulating film 18b is the outermost layer, and thus that surface of the upper electrode 18 which is exposed to the plasma generation region is an insulative surface (i.e., the counter surface of the upper electrode 18 is covered with the insulative surface). Further, the inner surface of the chamber 1 is also covered with a similar insulating film.

Figure 5:
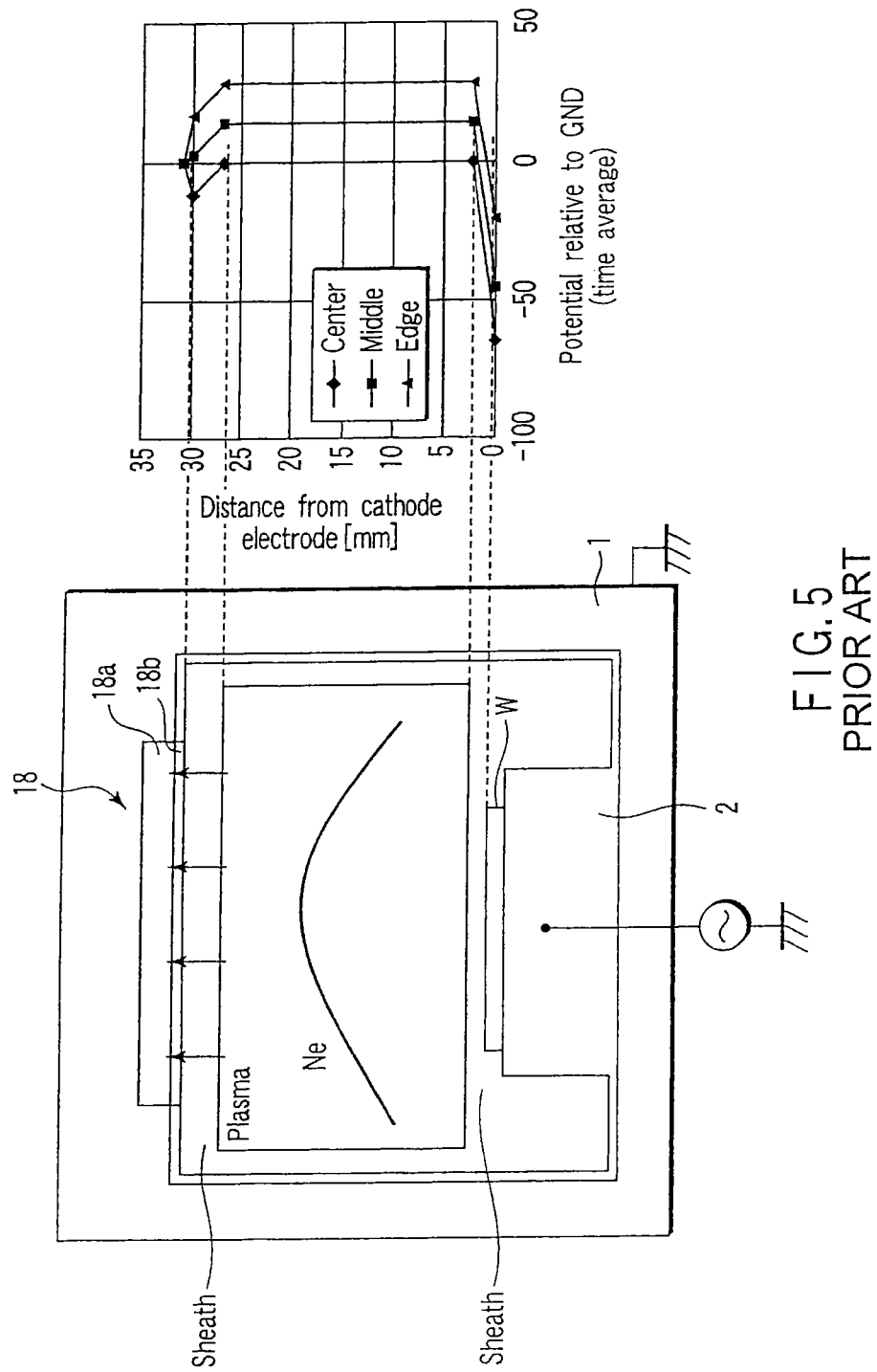
FIG. 5 is a view showing electron density distribution and plasma potential distribution in plasma where the conventional plasma etching apparatus is used.

FIG. 5 is a view showing electron density distribution and plasma potential distribution in plasma where the conventional plasma etching apparatus is used. In this apparatus, as shown in FIG. 5, when RF plasma is generated, an RF current flows through the insulating film 18b on the surface of the upper electrode 18 into the main body 18a, but scarcely flows in the radial direction (planar direction) in the surface of the insulating film 18b. With the RF plasma, the insulating film 18b on the surface of the upper electrode 18 comes to have a certain potential distribution in the radial direction, because of, e.g., a poor uniformity of electron density distribution. In this case, the potential distribution remains uneven, and the plasma potential comes to have a poor planar uniformity. Consequently, the support table 2 serving as a cathode electrode or lower electrode receives ion energy incident thereon with a certain planar distribution, thereby deteriorating the planar uniformity of wafer etching.

The conventional technique uses an RF power supply for plasma generation with a frequency of 27 MHz or less and a high process pressure (about 2 to 10 Pa) to generate plasma with high ion energy. In this case, even if the electrode surface has a certain potential distribution in the radial direction, as described above, no problem is caused. However, some of the recent techniques use an RF power supply with a frequency or 27 MHz or more and a low pressure (1.3 Pa or less) to from plasma with a low electron density ($1 \times 10^{10}$/cm$^3$ or less), and also use a negative gas as a process gas. In this case, the plasma has a high resistivity and thus makes the process uniformity poorer. Further, in order to improve the process performance, it is necessary to perform control at low ion energy (100 eV or less). In this case, a poor uniformity of energy due to a poor planar uniformity of the plasma potential cannot be ignored. Specifically, dielectric breakdown (charge-up damage) of a gate oxide film may be caused by a poor planar uniformity of the plasma etching process and a poor uniformity of charge-up on the wafer.

On the other hand, the upper electrode 18 of this embodiment is arranged, as shown in FIG. 6, in order to solve the problems described above. FIG. 6 is a view schematically showing a system for applying a DC voltage to the segments used in the plasma etching apparatus shown in FIG. 1. Specifically, the surface of the main body 18a facing the support table 2 is covered with the insulating film 18b, on which the conductive inner segment $18_{c1}$ and outer segment $18_{c2}$ are disposed concentrically and separately in the radial direction. The inner segment $18_{c1}$ and outer segment $18_{c2}$ are respectively connected to the positive terminal and negative terminal of the variable DC power supply 30.

In this embodiment, when RF plasma is generated, a voltage is applied between the inner segment $18_{c1}$ and outer segment $18_{c2}$. In this case, the plasma generation space is supplied with a voltage, to control the spatial electric potential distribution. Specifically, the spatial electric potential distribution shown in FIG. 5 can be changed such that the electric potential is increased more on the inner segment $18_{c1}$ than on the outer segment $18_{c2}$ to uniformize the spatial electric potential distribution. In FIG. 6, arrows I denote electric current flows in the plasma space due to the voltage application. The direction of this current becomes opposite where the polarity of the DC power supply is reversed.

As described above, the spatial electric potential distribution is uniformized, so that the support table 2 serving as the lower electrode or cathode electrode receives ion energy incident thereon with a uniform distribution. Further, the uniform ion energy brings about uniform electron energy in plasma generation, thereby resulting in a uniform electron density distribution. Consequently, it is possible to improve the planar uniformity of the etching process, and to reduce the charge-up damage, such as dielectric breakdown of gate oxide films. In addition, the variable DC power supply 30 is formed of a bipolar power supply, which can control the potential distribution within a range from a convex shape to a concave shape. In this case, it suffices if the DC voltage applied between the inner segment $18_{c1}$ and outer segment $18_{c2}$ is several tens of volts.

Even where one of the segments is supplied with a DC voltage, if the other segment is in a completely floating state, no electric potential difference is formed therebetween, and thus the effect described above cannot be obtained. A current derived from the applied DC voltage flows from the inner segment $18_{c1}$ through plasma into outer segment $18_{c2}$, so abnormal electric discharge can be hardly caused, and a member for grounding is unnecessary.

The feed lines 30a and 30b connected to the variable DC power supply 30 are respectively provided with the low-pass filters (LPFs) 31 and 33 to remove the RF influence on the variable DC power supply 30. The feed lines 30a and 30b are further provided with the relay switches 32 and 34 to turn on and off the DC voltage applied to the inner segment $18_{c1}$ and outer segment $18_{c2}$. The relay switches 32 and 34 are preferably disposed on the side closer to plasma from the low-pass filters (LPFs) 31 and 33, as shown in FIG. 6. If the relay switches 32 and 34 are disposed on the side closer to the variable DC power supply 30 from the low-pass filters (LPFs) 31 and 33, the following problem arises when no DC voltage is applied to the segments. Specifically, when the relay switches 32 and 34 are in the OFF-state, an RF power from plasma may pass through the low-pass filters, thereby changing the plasma state inside the chamber 1. This matter is common to all the following embodiments.

The material of the inner segment $18_{c1}$ and outer segment $18_{c2}$ is not limited to a specific one, as long as it is conductive. Since the segments are required only to supply a voltage to the plasma space, they are allowed to have a somewhat high resistivity, as high as $1 \times 10^6$ Ωcm, which allows the use of, e.g., Si or SiC. Further, even where the surface state varies to some extent, the effect described above is maintained.

According to this embodiment, the conductive inner segment $18_{c1}$ and outer segment $18_{c2}$ are formed on the insulating film $18b$ conventionally used for a protection function, and thus the advantages described are obtained in addition to the conventional protection function. Further, since the conductive layers are formed on a conventional upper electrode, the apparatus structure does not need to be greatly changed.

FIGS. 7A and 7B are views schematically showing modifications of a system for applying a DC voltage to the segments usable in the plasma etching apparatus shown in FIG. 1. In the structure shown in FIG. 6, the inner segment $18_{c1}$ and outer segment $18_{c2}$ are in a floating state except for the connection to the variable DC power supply 30. In the modification shown in FIG. 7A, the outer segment $18_{c2}$ is grounded. In the modification shown in FIG. 7B, the inner segment $18_{c1}$ is grounded. As shown in these modifications, where one of the segments is grounded, the spatial electric potential on the non-grounded side is largely adjustable while the spatial electric potential on the grounded side is not changed so much.

Figure 8:
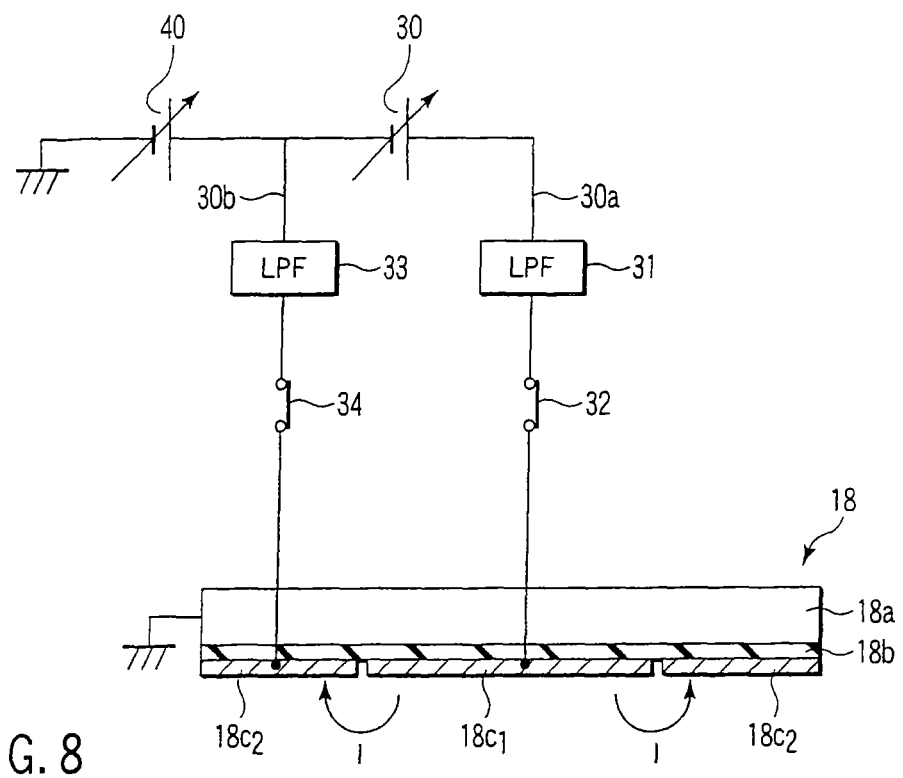
FIG. 8 is a view schematically showing an alternative modification of a system for applying a DC voltage to the segments usable in the plasma etching apparatus shown in FIG. 1.

FIG. 8 is a view schematically showing an alternative modification of a system for applying a DC voltage to the segments usable in the plasma etching apparatus shown in FIG. 1. In the modification shown in FIG. 8, another variable DC power supply 40 is connected to one of the segment, in addition to the variable DC power supply 30 for controlling the spatial electric potential distribution. In FIG. 8, the variable DC power supply 40 is connected to the outer segment $18_{c2}$, but it may be connected to the inner segment $18_{c1}$. As in this modification, where one of the segments is connected to the variable DC power supply 40, the degree of the spatial electric potential (the potential difference between the plasma and electrode main body $18a$) can be adjusted while the spatial electric potential distribution is maintained. Since the distribution and degree of the spatial electric potential are adjustable, the ion energy relative to the wafer W can be controlled with high accuracy. Further, since the degree of the spatial electric potential is adjustable, the deposition onto the upper electrode 18 can be controlled. Furthermore, since the degree of the spatial electric potential itself is adjustable by the variable DC power supply 40, the variable DC power supply 30 for distribution control is not required to apply a high voltage and thus this power supply can be compact.

Figure 9:
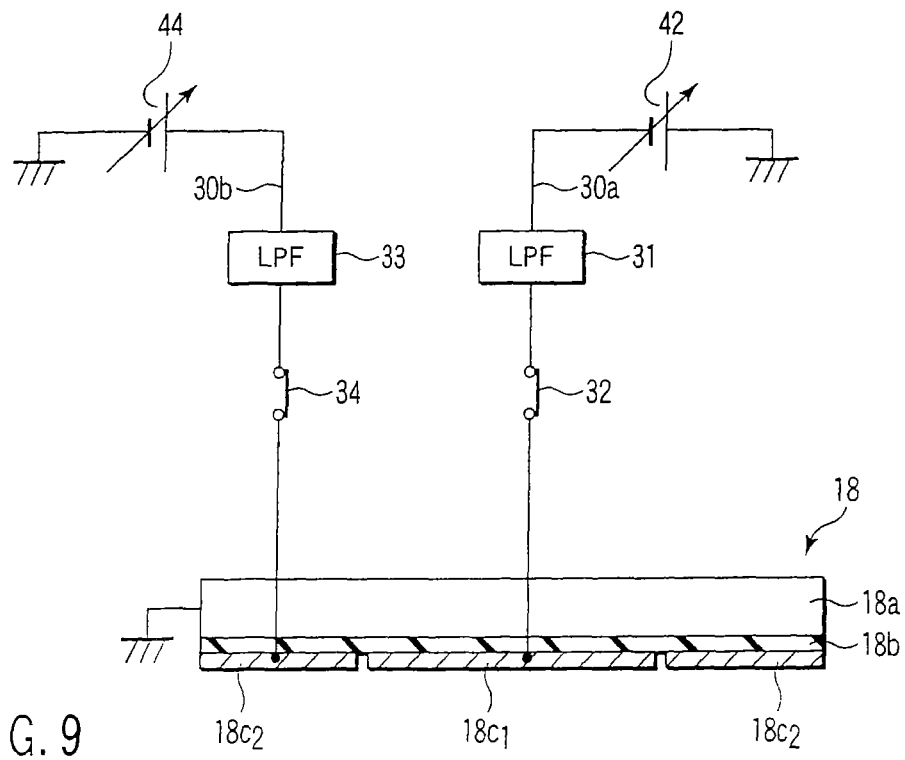
FIG. 9 is a view schematically showing a further alternative modification of a system for applying a DC voltage to the segments usable in the plasma etching apparatus shown in FIG. 1.

FIG. 9 is a view schematically showing a further alternative modification of a system for applying a DC voltage to the segments usable in the plasma etching apparatus shown in FIG. 1. In the modification shown in FIG. 9, the inner segment $18_{c1}$ is connected to a variable DC power supply 42, and the outer segment $18_{c2}$ is connected to another variable DC power supply 44. With this arrangement, the voltages applied to the inner segment $18_{c1}$ and outer segment $18_{c2}$ can be independently controlled from each other.

Figure 10:
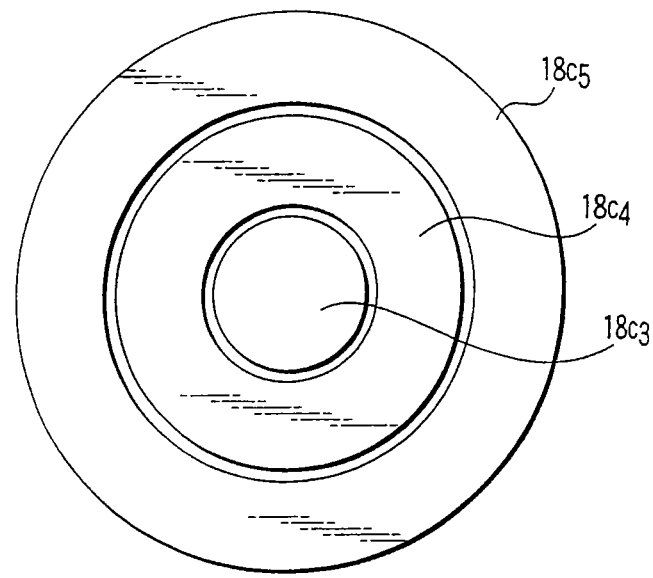
FIG. 10 is a view schematically showing a plan view layout of segments used in the upper electrode of a plasma etching apparatus or plasma processing apparatus according to another embodiment of the present invention.
Figure 11:
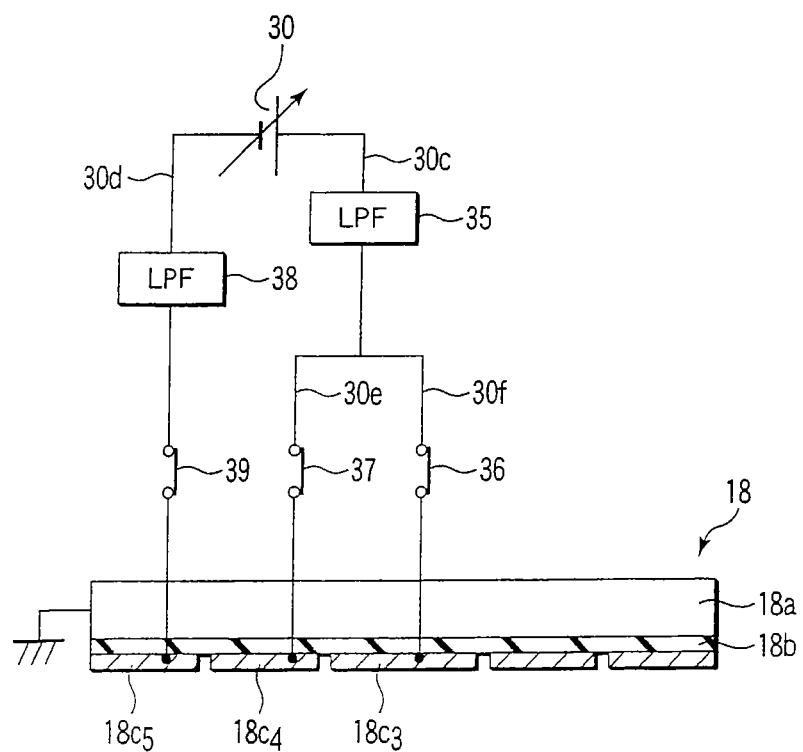
FIG. 11 is a view schematically showing a system for applying a DC voltage to the segments used in the plasma etching apparatus according to the embodiment shown in FIG. 10.

FIG. 10 is a view schematically showing a plan view layout of segments used in the upper electrode of a plasma etching apparatus or plasma processing apparatus according to another embodiment of the present invention. FIG. 11 is a view schematically showing a system for applying a DC voltage to the segments used in the plasma etching apparatus according to the embodiment shown in FIG. 10.

This embodiment includes an upper electrode 18 in which three segments $18_{c3}$, $18_{c4}$, and $18_{c5}$ are concentrically disposed in this order from the inner side on the surface of an insulating film $18b$. The outermost segment $18_{c5}$ is connected to the negative terminal of a variable DC power supply 30 through a feed line $30d$. The middle segment $18_{c4}$ and innermost segment $18_{c3}$ are connected to the positive terminal of the variable DC power supply 30 respectively through feed lines $30e$ and $30f$ branched from a feed line $30c$. The feed lines $30e$ and $30f$ are respectively provided with relay switches 36 and 37, so that the positive terminal of the variable DC power supply 30 can be connected to either or both of the segments $18_{c3}$ and $18_{c4}$. The feed line $30c$ is provided with a low-pass filter (LPF) 35. The feed line $30d$ is provided with a low-pass filter (LPF) 38 and a relay switch 39 for turning on and off the DC voltage.

With this arrangement, the segments to be supplied with the voltage can be selected by switching. The spatial electric potential distribution can be adjusted at a selected position, thereby improving the flexibility in controlling the spatial electric potential distribution.

Next, an explanation will be given of experiments performed to confirm advantages of the present invention.

At first, an upper electrode was prepared such that the counter surface of a main body was covered with a 250 μm thermal spraying film of $Y_2O_3$, and an inner segment and an outer segment both made of Si were concentrically disposed on the film. A plasma process was performed on a wafer, while one of the inner segment and outer segment was grounded, and the other was supplied with a predetermined DC voltage. The wafer was a 300-mm wafer, and the upper electrode had a diameter of 340 mm. The inner segment had a radius of 100 mm, and the outer segment had an outer radius of 180 mm. The plasma process was performed in the apparatus shown in FIG. 1, under the conditions of: the pressure inside the chamber was set at 0.67 Pa, the process gas was $O_2$ gas with a flow rate of 200 mL/min, and the RF power was set to be with a frequency of 100 MHz at different power levels of 200 W, 500 W, 800 W, and 1,200 W. At this time, the planar distribution of plasma potential Vf relative to the ground potential (GND), planar distribution of self-bias voltage Vdc, and planar distribution of electron density distribution Ne were measured.

Figure 13A:
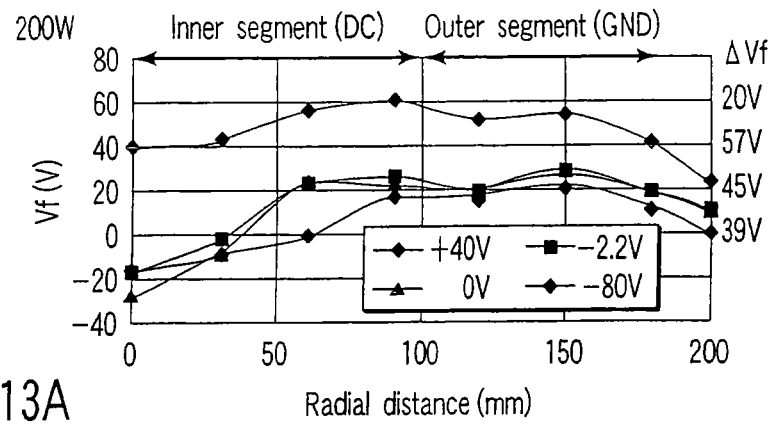
FIGS. 13A, 13B, and 13C are views showing the planar distribution of plasma potential Vf, planar distribution of self-bias voltage Vdc, and planar distribution of electron density distribution Ne, respectively, where the RF power was set at 200 W, the outer segment was grounded, and the inner segment was supplied with the DC voltage at different voltage values.
Figure 13B:
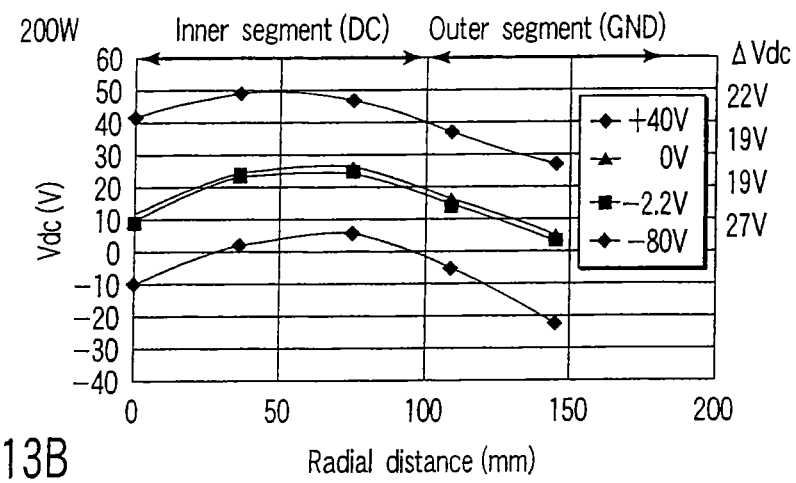
Figure 13C:
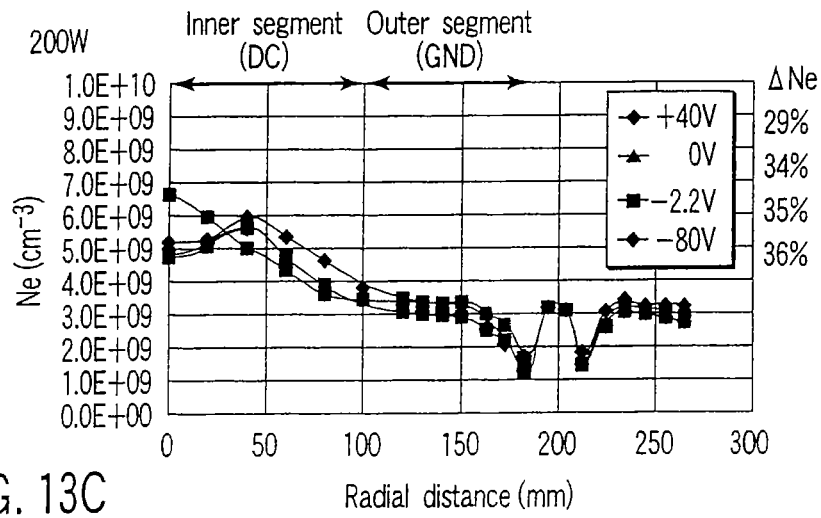
Figure 15A:
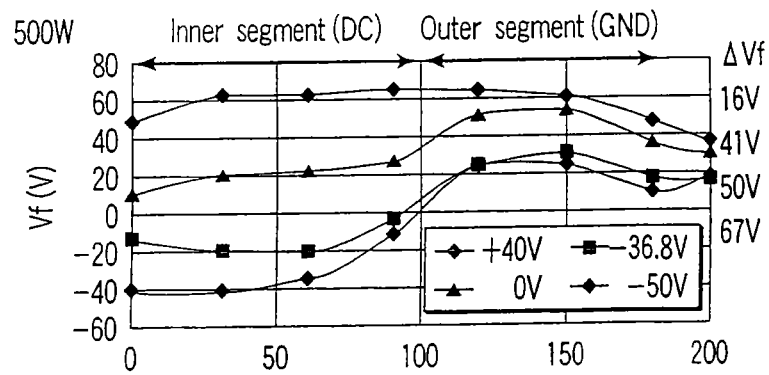
FIGS. 15A, 15B, and 15C are views showing the planar distribution of plasma potential Vf, planar distribution of self-bias voltage Vdc, and planar distribution of electron density distribution Ne, respectively, where the RF power was set at 500 W, the outer segment was grounded, and the inner segment was supplied with the DC voltage at different voltage values.
Figure 15B:
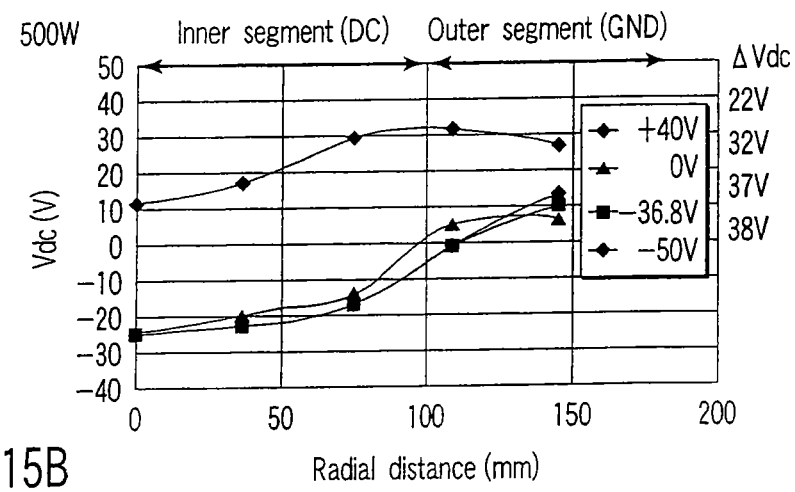
Figure 15C:
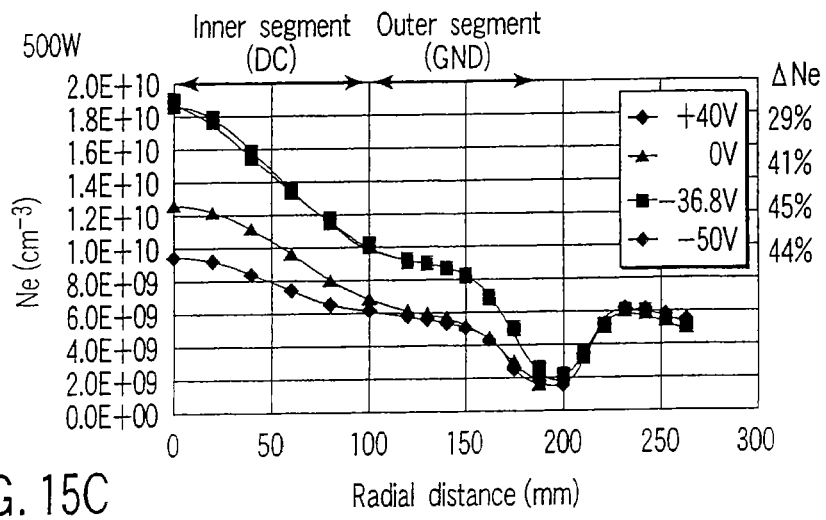
Figure 16A:
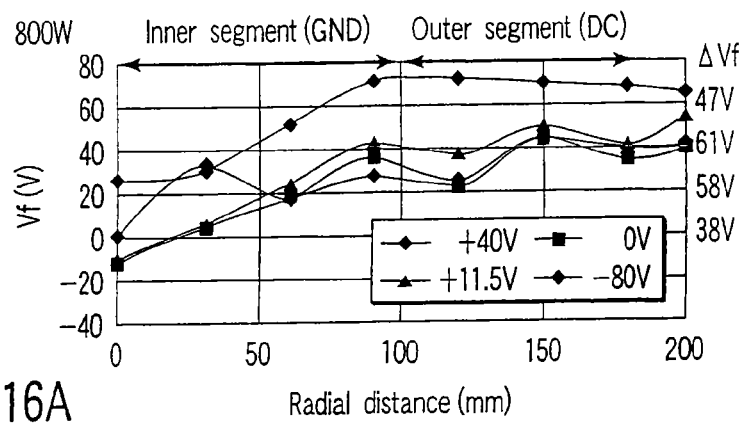
FIGS. 16A, 16B, and 16C are views showing the planar distribution of plasma potential Vf, planar distribution of self-bias voltage Vdc, and planar distribution of electron density distribution Ne, respectively, where the RF power was set at 800 W, the inner segment was grounded, and the outer segment was supplied with the DC voltage at different voltage values.
Figure 16B:
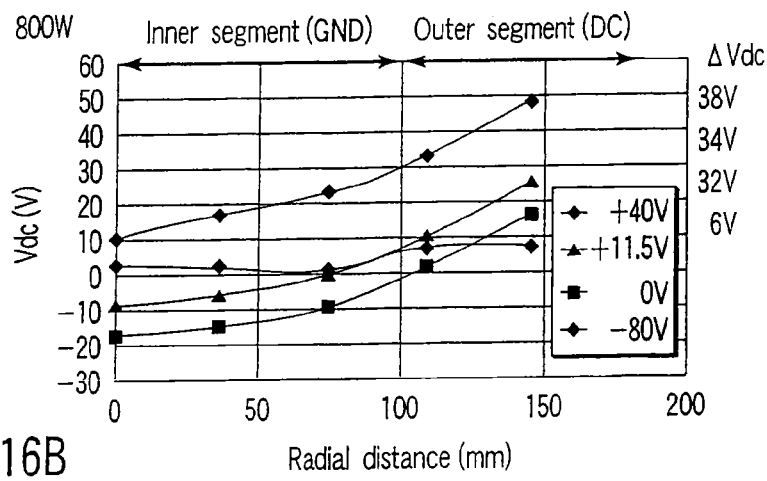
Figure 16C:
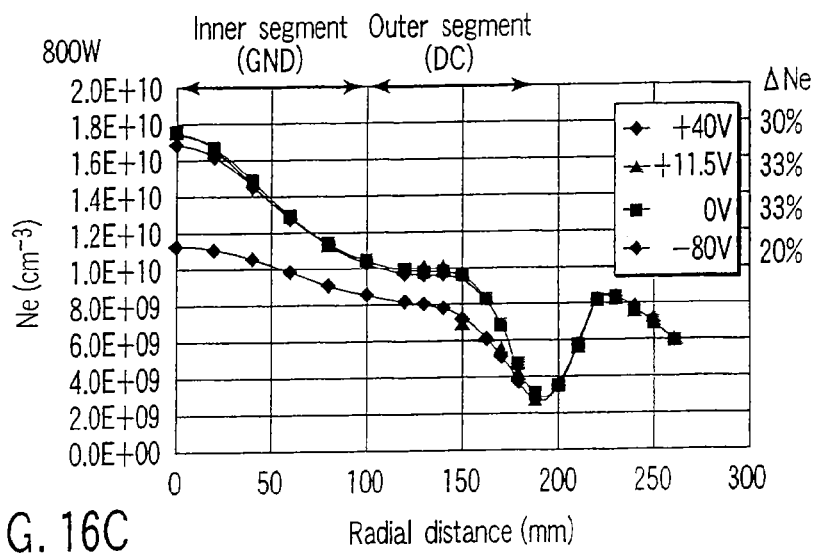
Figure 17A:
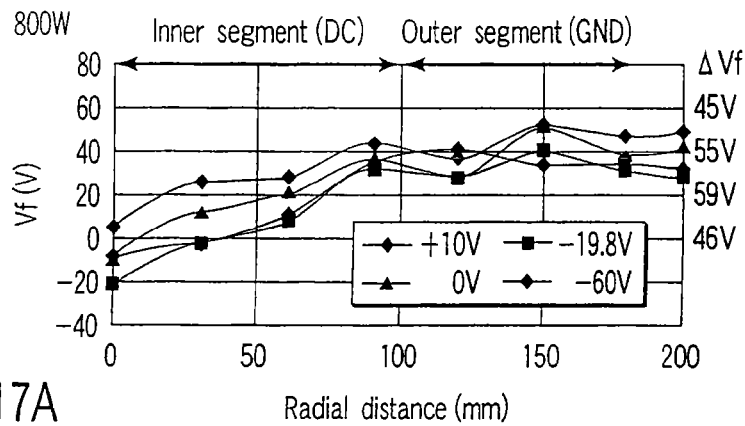
FIGS. 17A, 17B, and 17C are views showing the planar distribution of plasma potential Vf, planar distribution of self-bias voltage Vdc, and planar distribution of electron density distribution Ne, respectively, where the RF power was set at 800 W, the outer segment was grounded, and the inner segment was supplied with the DC voltage at different voltage values.
Figure 17B:
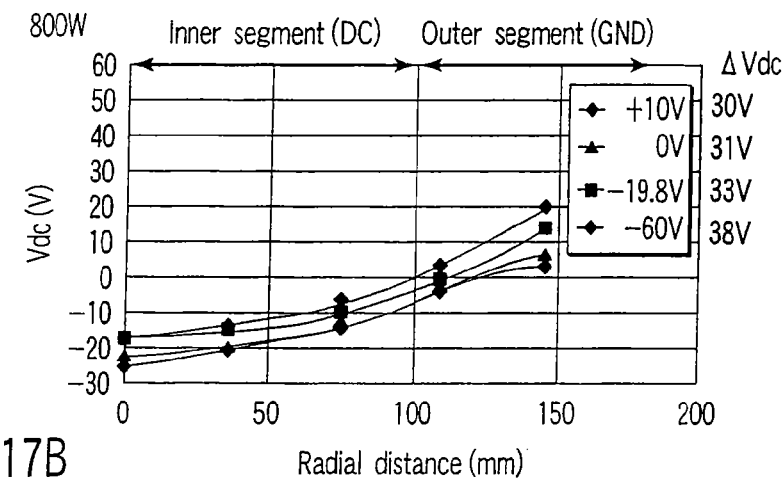
Figure 17C:
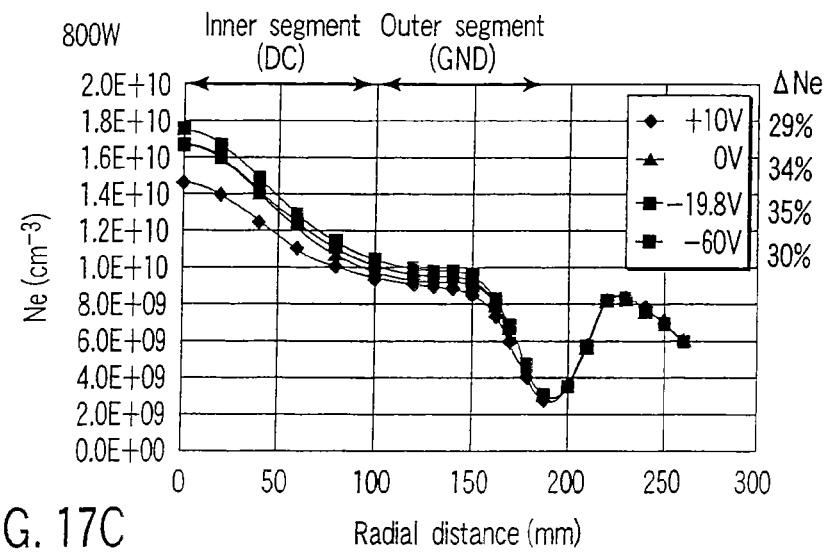
Figure 18A:
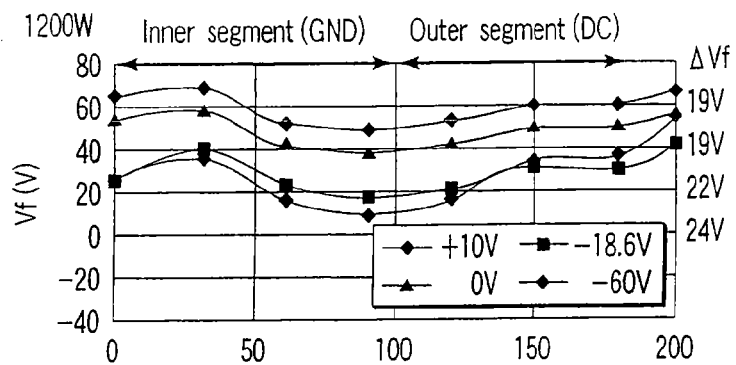
FIGS. 18A, 18B, and 18C are views showing the planar distribution of plasma potential Vf, planar distribution of self-bias voltage Vdc, and planar distribution of electron density distribution Ne, respectively, where the RF power was set at 1,200 W, the inner segment was grounded, and the outer segment was supplied with the DC voltage at different voltage values.
Figure 18B:
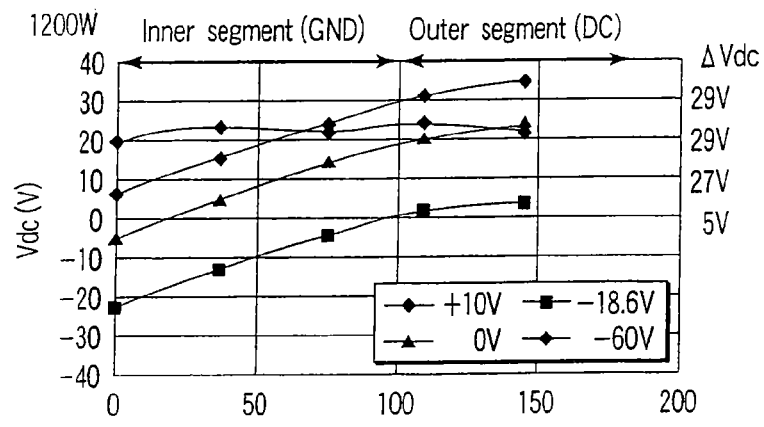
Figure 18C:
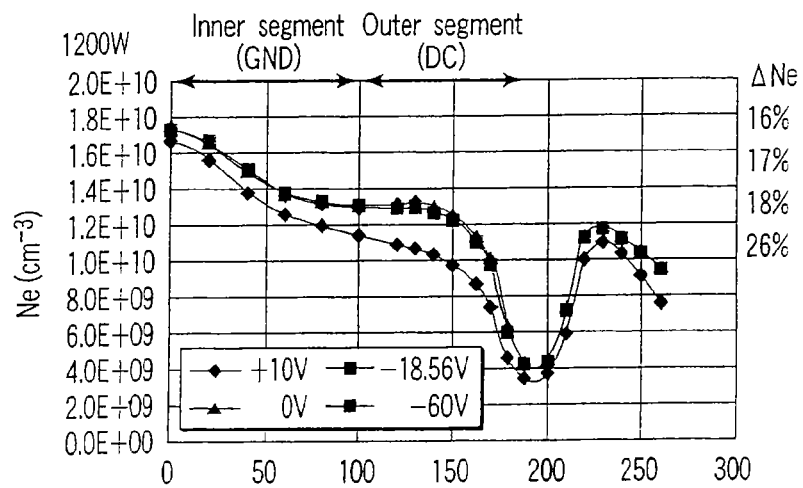
Figure 19A:
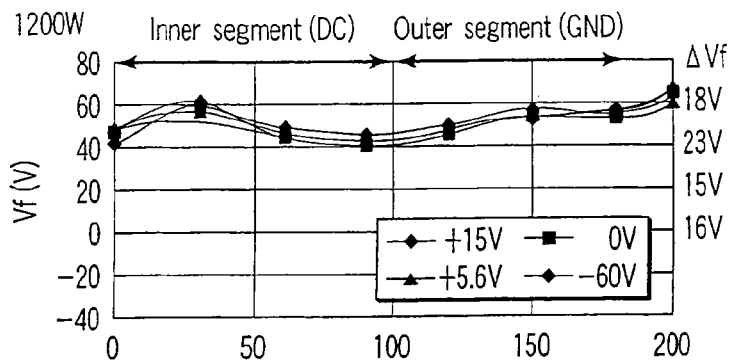
FIGS. 19A, 19B, and 19C are views showing the planar distribution of plasma potential Vf, planar distribution of self-bias voltage Vdc, and planar distribution of electron density distribution Ne, respectively, where the RF power was set at 1,200 W, the outer segment was grounded, and the inner segment was supplied with the DC voltage at different voltage values.
Figure 19B:
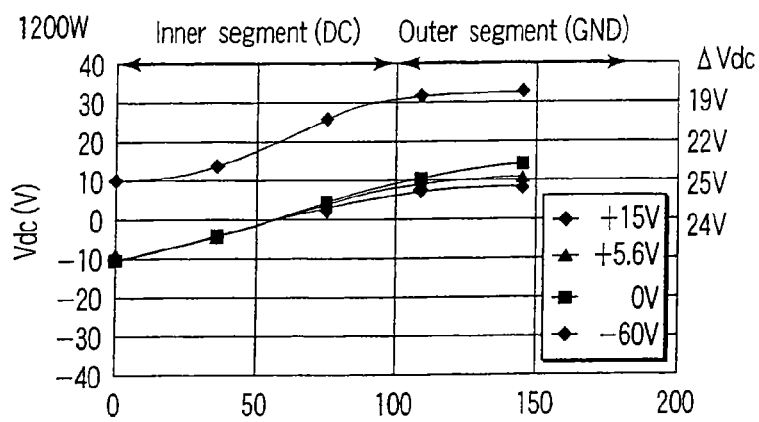
Figure 19C:
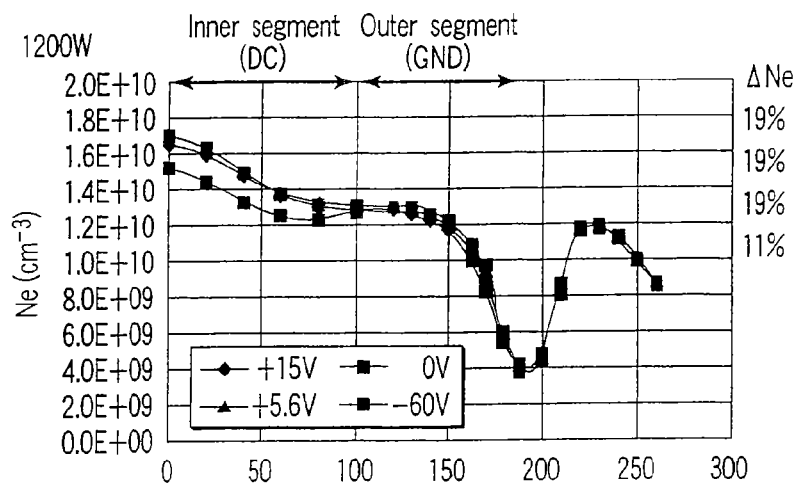

FIGS. 12A, 12B, and 12C to FIGS. 19A, 19B, and 19C show data obtained in this experiment. FIGS. 12A, 12B, and 12C shows a case where the RF power was set at 200 W, the inner segment was grounded, and the outer segment was supplied with the DC voltage at different voltage values of +40V, +20V, 0V, and −80V. FIGS. 13A, 13B, and 13C shows a case where the RF power was set at 200 W, the outer segment was grounded, and the inner segment was supplied with the DC voltage at different voltage values of +40V, 0V, −2.2V, and −80V. FIGS. 14A, 14B, and 14C shows a case where the RF power was set at 500 W, the inner segment was grounded, and the outer segment was supplied with the DC voltage at different voltage values of +50V, 0V, −50V, and −100V. FIGS. 15A, 15B, and 15C shows a case where the RF power was set at 500 W, the outer segment was grounded, and the inner segment was supplied with the DC voltage at different voltage values of +40V, 0V, −36.8V, and −50V. FIGS. 16A, 16B, and 16C shows a case where the RF power was set at 800 W, the inner segment was grounded, and the outer segment was supplied with the DC voltage at different voltage values of +40V, +11.5V, 0V, and −80V. FIGS. 17A, 17B, and 17C shows a case where the RF power was set at 800 W, the outer segment was grounded, and the inner segment was supplied with the DC voltage at different voltage values of +10V, 0V, −19.8V, and −60V. FIGS. 18A, 18B, and 18C shows a case where the RF power was set at 1,200 W, the inner segment was grounded, and the outer segment was supplied with the DC voltage at different voltage values of +10V, 0V, −18.6V, and −60V. FIGS. 19A, 19B, and 19C shows a case where the RF power was set at 1,200 W, the outer segment was grounded, and the inner segment was supplied with the DC voltage at different voltage values of +15V, +5.6V, 0V, and −60V. FIGS. 12A, 13A, 14A, 15A, 16A, 17A, 18A, and 19A show the planar distribution of plasma potential Vf, wherein ΔVf denotes planar fluctuation of Vf. FIGS. 12B, 13B, 14B, 15B, 16B, 17B, 18B, and 19B show the planar distribution of self-bias voltage Vdc, wherein ΔVdc denotes planar fluctuation of Vdc. FIGS. 12C, 13C, 14C, 15C, 16C, 17C, 18C, and 19C show the planar distribution of electron density distribution Ne, wherein ΔNe denotes a value in percentage terms obtained where the difference between the planar maximum value and minimum value of Ne is divided by the double of the planar mean value of Ne.

As shown in these figures, it was confirmed that, where a voltage was applied to the segments according to the embodiment shown in FIG. 1, the planar distribution of plasma potential Vf, planar distribution of self-bias voltage Vdc, and planar distribution of electron density distribution Ne could be adjusted and controlled. Particularly, in the case shown in FIGS. 14A, 14B, and 14C where the RF power was set at 500 W, the inner segment was grounded, and the outer segment was supplied with the DC voltage at different voltage values, all the planar distributions of Vf, Vdc, and Ne were uniformized when the DC voltage was at −100V. Further, in the case shown in FIGS. 15A, 15B, and 15C where the RF power was set at 500 W, the outer segment was grounded, and the inner segment was supplied with the DC voltage at different voltage values, all the planar distributions of Vf, Vdc, and Ne were uniformized when the DC voltage was at +40V.

Next, an experiment was conducted where the inner segment was supplied with the DC voltage at different voltage values, while no voltage was applied from a distribution control power supply, to measure the planar distribution of plasma potential Vf. The RF power was set at different values of 200 W and 500 W, and the other conditions were set to be the same as those in the experiment described above.

FIGS. 20A and 20B show data obtained in this experiment. FIG. 20A shows the planar distribution of plasma potential Vf relative to the ground potential (GND) where the RF power was set at 200 W, and the inner segment was supplied with the DC voltage at different voltage values of +50V, −36V, and −120V. FIG. 20B shows the planar distribution of plasma potential Vf relative to the ground potential (GND) where the RF power was set at 500 W, and the inner segment was supplied with the DC voltage at different voltage values of +10V, −56V, and −120V. As shown in these figures, it was confirmed that, where the voltage of the other DC power supply was changed, the degree of Vf was adjustable while the distribution pattern of Vf was essentially maintained.

The present invention is not limited to the embodiments described above, and it may be modified in various manners. For example, in the embodiments described above, the segments are disposed on the lower surface of the upper electrode through an insulating film to define a part of the ceiling of the process chamber 1. In this respect, FIG. 21 is a view schematically showing another example of an upper electrode. In this example, an upper electrode 118 comprising an inner segment 118a and an outer segment 118b is disposed separately from the ceiling of a process chamber 1. In this case, the inner segment 118a and outer segment 118b may be arranged to form a mesh.

In the embodiments described above, the segments are concentrically disposed, but they may be not necessarily concentric. Further, in the embodiments described above, the number of segments is two or three, but it may be four or more. In the embodiment shown in FIGS. 10 and 11, the segments $18_{c3}$ and $18_{c4}$ connected to one of the terminals of the DC power supply can be switched therebetween. Alternatively or further, the segment $18_{c5}$ connected to the other of the terminals may be also divided into two portions and configured to be switched therebetween. The embodiment shown in FIGS. 10 and 11 may be combined with the structures shown in FIGS. 7A, 7B, 8, and 9.

In the embodiments described above, the ring magnets are used to form a magnetic field around the process space. Each of the ring magnets has a plurality of segment magnets formed of permanent magnets and disposed around the chamber to be a ring in a multi-pole state. However, such magnetic field forming means is not necessarily required. Further, in the embodiments described above, the present invention is applied to plasma etching, but it may be applied to another plasma process, such as plasma CVD or sputtering. Similarly, other apparatus components, the material of the conductive layer, and so forth are not limited to those of the embodiments described above, and they may be modified in various manners. Furthermore, in the embodiments described above, the target substrate is a semiconductor wafer, but it may be applied to another substrate for, e.g., flat panel displays (FPDs), such as LCDs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A capacitive coupling plasma processing apparatus comprising;

a chamber configured to maintain a vacuum atmosphere;

first and second electrodes disposed opposite to each other inside the chamber; and a plasma generation mechanism configured to generate process gas plasma by forming a radio frequency (RF) electric field between the first and second electrodes, wherein the plasma generation mechanism includes an RF power supply connected to the first electrode, the first electrode is configured to support a process target substrate and to be supplied with an RF power from the RF power supply, the second electrode includes a plurality of segments separated in concentric state and disposed at a position opposite to the first electrode, and a conductive main body supporting the plurality of segments through a planar insulating film in an integrated state, such that the main body is grounded and the plurality of segments are set in a floating state or is grounded via a conductive portion, the apparatus further comprises variable direct current (DC) power supplies for applying a DC voltage to at least one of the plurality of segments, to control spatial electric potential distribution in radial directions of the second electrode by applying a DC voltage to at least one of the plurality of segments from the variable DC power supplies, and the plurality of segments include a first segment and a second segment, and the variable DC power supplies include a first variable DC power supply configured to apply a DC voltage to the first segment, and a second variable DC power supply configured to apply a DC voltage to the second segment independently of the first segment.

2. The apparatus according to claim 1, wherein the first and second variable DC power supplies are configured to set a voltage between the first and second segments.

3. The apparatus according to claim 1, wherein the first variable DC power supply is configured to set a voltage between the first and second segments.

4. The apparatus according to claim 3, wherein the first variable DC power supply includes one terminal connected to the first segment and another terminal connected to the second segment.

5. The apparatus according to claim 4, wherein one of the first segment and the second segment is grounded and the other is set in a floating state.

6. The apparatus according to claim 4, wherein the second variable DC power supply includes one terminal connected to the second segment and another terminal that is grounded.

7. The apparatus according to claim 4, wherein the first variable DC power supply includes a positive terminal connected to an inner segment of the first and second segments and a negative terminal connected to an outer segment of the first and second segments.

8. The apparatus according to claim 5, wherein an inner segment of the first and second segments is set in a floating state, and the first variable DC power supply includes a positive terminal connected to the segment set in a floating state and a negative terminal connected to the segment that is grounded.

9. The apparatus according to claim 6, wherein the first variable DC power supply includes a positive terminal connected to an inner segment of the first and second segments and a negative terminal connected to an outer segment of the first and second segments, and the second variable DC power supply includes a positive terminal connected to the outer segment.

10. The apparatus according to claim 1, wherein each of the first and second variable DC power supplies is a bipolar power supply.

11. The apparatus according to claim 1, wherein each of the first and second segments is arranged to form a mesh.

12. The apparatus according to claim 1, wherein the apparatus further comprises switches respectively disposed between the first and second variable DC power supplies and the first and second segments to turn on and off a DC voltage.

13. The apparatus according to claim 1, wherein the apparatus further comprises low-pass filters respectively disposed between the first and second variable DC power supplies and the first and second segments.

14. The apparatus according to claim 1, wherein an inner segment of the first and second segments is set to have electric potential higher than that of an outer segment of the first and second segments.

* * * * *